United States Patent [19]

Cellini, Jr. et al.

[11] Patent Number: 5,196,803
[45] Date of Patent: Mar. 23, 1993

[54] APPARATUS AND METHOD FOR DETERMINING THE VOLTAGE BREAKDOWN AND CONDUCTIVITY OF PARTICULATE MATERIAL

[75] Inventors: Michael Cellini, Jr., East Rochester; Rudolph Forgensi; Edward J. Gutman, both of Webster; Kallis H. Mannik, Penfield; Robert J. Turchetti, Webster; Donald H. Wood, Penfield; Morris M. DeYoung, Jr., Farmington, all of N.Y.

[73] Assignee: Xerox Corporation, Stamford, Conn.

[21] Appl. No.: 739,034

[22] Filed: Aug. 1, 1991

[51] Int. Cl.$^5$ .............................................. G01R 27/14
[52] U.S. Cl. .................................. 324/713; 324/693; 324/705; 324/450
[58] Field of Search ............... 324/693, 705, 713, 717, 324/718, 444, 450

[56] References Cited

U.S. PATENT DOCUMENTS

| | | | |
|---|---|---|---|
| 4,047,105 | 9/1977 | Anderson | 324/713 X |
| 4,257,348 | 3/1981 | Prohaska | 324/236 X |
| 4,357,901 | 11/1982 | Fagen, Jr. et al. | 324/219 X |
| 4,399,502 | 8/1983 | MacDonald et al. | 364/189 |
| 4,402,055 | 8/1983 | Lloyd et al. | 364/579 |
| 4,640,129 | 2/1987 | Miyakawa et al. | 324/202 X |
| 4,646,000 | 2/1987 | Wills | 324/693 X |
| 4,656,832 | 4/1987 | Yukihisa et al. | 324/717 X |
| 4,839,581 | 6/1989 | Peterson, Jr. | 324/450 X |

Primary Examiner—Jack B. Harvey
Assistant Examiner—Glenn W. Brown
Attorney, Agent, or Firm—Gary B. Cohen

[57] ABSTRACT

An apparatus and method for determining both the breakdown voltage and the conductivity of a particulate material, such as a developer material, is provided. In a preferred embodiment, the apparatus for determining breakdown voltage comprises a breakdown cell for storing a preselected quantity of the particulate material and a voltage breakdown ("VB") autometer, the VB autometer being adapted to apply a first voltage across at least portions of the preselected quantity of the particulate material. The VB autometer is capable of progressively varying the magnitude of the first voltage. A measuring circuit, for measuring a second voltage, is coupled to the voltage breakdown cell. When the second voltage substantially equals a preselected reference voltage, the first voltage substantially equals the breakdown voltage of the particulate material.

13 Claims, 4 Drawing Sheets

APPARATUS AND METHOD FOR DETERMINING THE VOLTAGE BREAKDOWN AND CONDUCTIVITY OF PARTICULATE MATERIAL

BACKGROUND OF THE INVENTION

1. Field of the Invention

The present invention relates generally to a technique for testing electrical properties of particulate material and, more specifically, to an apparatus and method for determining both breakdown voltage and conductivity of developer material.

2. Description of the Prior Art

In electrophotographic applications such as xerography, a charge retentive surface is electrostatically charged, and exposed to a light pattern of an original image to be reproduced for selectively discharging the surface in accordance therewith. The resulting pattern of charged and discharged areas on that surface form an electrostatic charge pattern (an electrostatic latent image) conforming to the original image. The latent image is developed by contacting it with a finely divided electrostatically attractable powder referred to as "toner". Toner is held on the image areas by the electrostatic charge on the surface. Thus, a toner image is produced in conformity with a light image of the original being reproduced. The toner image may then be transferred to a substrate or support member (e.g., paper), and the image affixed thereto to form a permanent record of the image to be reproduced. Subsequent to development, excess toner left on the charge retentive surface is cleaned from the surface. The process is well known, and useful for light lens copying from an original, and/or printing applications from electronically generated or stored originals.

Developer material commonly used in systems for developing latent images on the charge retentive surface typically comprises a mixture of toner and a "carrier" of larger granular beads of a ferrous material. If the developing system is a magnetic brush assembly, magnetizable carrier beads also provide mechanical control for the formation of magnetic brush bristles so that toner can readily be brought into contact with the charge retentive surface. Toner is attracted to the latent image from the carrier beads to form the toner image.

Developer material composition is characterized by electrical properties or parameters, such as breakdown voltage and conductivity. It has been found that the magnitudes of breakdown voltage and conductivity for a given batch of developer material can be used as "signatures" of developer material composition since the magnitudes of the breakdown voltage and the conductivity vary as a function of the composition and processing of the developer material. In some instances, the composition and manufacturing process of the developer material may be varied from batch to batch to accommodate for operational differences among printing apparatuses. For example, one printing apparatus may be designed to use a developer material having a composition that significantly differs from the composition of a developer material used in another printing apparatus. In other instances the composition of developer material may vary among batches simply as a result of error associated with manufacturing the developer material.

To monitor these compositional variations in developer material, it would be desirable to provide an arrangement that measures the breakdown voltage and conductivity both automatically and precisely. The disclosures of the following references, all of which generally relate to automatic testing arrangements, may be pertinent to various aspects of the apparatus and method of the present invention:

U.S. Pat. No. 4,399,502 Patentee: MacDonald et al. Issued: Aug. 16, 1983

U.S. Pat. No. 4,402,055 Patentee: Lloyd et al. Issued: Aug. 30, 1983

Petersen et al. "System Controller—A Universal Control Unit for System-Compatible Measuring Instruments" Systems and Equipment pp. 25–29

U.S. Pat. No. 4,399,502 discloses a system for remotely controlling one or more instruments from a control terminal. Each instrument includes a stored menu of operations it can perform under control of the terminal. The terminal further includes means for directing the instrument to perform operations indicated by the menu. The system has a command menu which includes input parameters to control the operation of an instrument, output parameters that an instrument can measure or compute, and procedures that an instrument can perform.

U.S. Pat. No. 4,402,055 discloses an automatic test system controlled by a general purpose digital central processor. The central processor accepts test programs in a high level compiler language. Each program is compacted into a simplified language, the language being used to communicate with test devices through a standard IEEE 488 data bus. Each test device includes a programmable interface digital processor, which interface performs any translation necessary to permit specific test instruments, coupled to the central processor through the interface processor, to perform the tests specified by the high level test program.

The article, entitled "System Controller—A Universal Control Unit for System-Compatible Measuring Instruments," discloses an automatic testing system including a table-top computer for control of instruments compatible with an IEC bus. The controller is capable of solving general mathematical problems as well as evaluating and interpreting the results of measurements and calculations. The system is programmable using BASIC.

SUMMARY OF THE INVENTION

In accordance with the invention there is provided an improved apparatus and method for determining both the breakdown voltage and conductivity of a particulate material. The apparatus for determining voltage breakdown comprises means for storing a preselected quantity of particulate material and means for applying a first voltage across at least a portion of a preselected quantity of the particulate material. The applying means is adapted to vary progressively the magnitude of the first voltage. Means for measuring a second voltage is coupled to the storing means, wherein the breakdown voltage substantially equals the first voltage when the second voltage substantially equals a preselected reference voltage.

In one aspect of the invention, the storing means comprises a voltage breakdown cell adapted to support the preselected quantity of particulate material with at least portions of the voltage breakdown cell being in electrical communication with the preselected quantity of the particulate material. Additionally, the applying means preferably includes power supply means and the means for varying can comprise a programmable microcomputer. Finally, the measuring means can be a measuring circuit coupled to the voltage breakdown cell.

The apparatus for determining conductivity comprises a voltage breakdown cell adapted to support the preselected quantity of particulate material with at least portions of the voltage breakdown cell being in electrical communication with the preselected quantity of the particulate material. Power supply means for generating a first voltage across the portion of the preselected quantity of the particulate material supported by the voltage breakdown cell is coupled operatively to the voltage breakdown cell portions. Means for determining conductivity of the particulate material, when a voltage is applied across the particulate material, is coupled to the voltage breakdown cell.

In a preferred form of operation, breakdown voltage is determined by generating a first voltage across the voltage breakdown cell having portions thereof in electrical communication with at least a portion of the preselected quantity or the particulate material. A second voltage, across a circuit coupled to the voltage breakdown cell, is also measured. The level of the second voltage is compared with a predetermined reference level, and the level of the first voltage is increased automatically until the second voltage level is substantially equal to the predetermined reference level. When the second voltage level is substantially equal to the predetermined reference level, the first voltage is proportional or equal to the breakdown voltage of the particulate material.

Numerous features of the present invention will be appreciated by those skilled in the art. First, the voltage breakdown cell is constructed to allow for measurement of breakdown voltage and/or conductivity for a wide variety of developer material in a setting simulating a developer apparatus of the type employed in a printing apparatus. Second, since the applying means can comprise a programmable microcomputer, voltages can be varied progressively across the voltage breakdown cell and either the measuring circuit or the isolation and protection circuit in precise steps at uniform intervals. Moreover, employment of the microcomputer allows for highly precise determinations of breakdown voltage and conductivity. When the microcomputer is used to apply voltages or make measurements, human error is alleviated considerably.

These and other aspects of the invention will become apparent from the following description, the description being used to illustrate a preferred embodiment of the invention when read in conjunction with the accompanying drawings.

DESCRIPTION OF THE PREFERRED EMBODIMENT

While the present invention will hereinafter be described in connection with a preferred embodiment thereof, it will be understood that it is not intended to limit the invention to that embodiment. On the contrary, it is intended to cover all alternatives, modifications and equivalents as may be included within the spirit and scope of the invention as defined by the appended claims.

In a printing apparatus, a latent image typically is developed by contacting a selectively charged surface with toner. The toner is obtained from a mixture commonly referred to as developer material, and the toner is extracted from a developing apparatus. The electrical properties of the developer material can be characterized by the magnitudes of breakdown voltage and conductivity. It has been found that these magnitudes are measured readily in an arrangement simulating, in part, the developer apparatus.

Figure 1A:
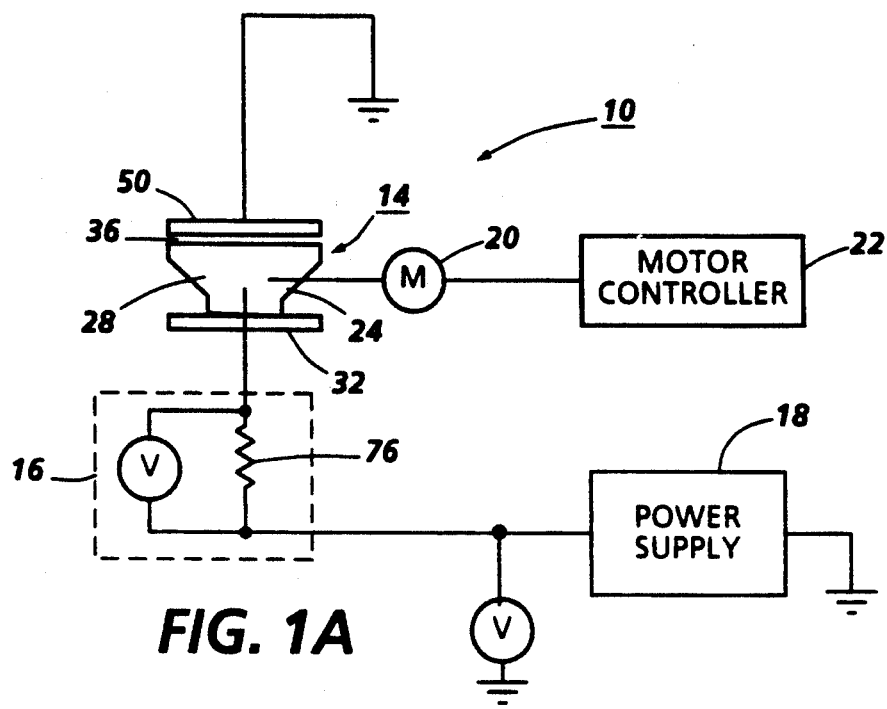
FIG. 1A is a schematic view of a network adapted to determine breakdown voltage of a particulate material.
Figure 1B:
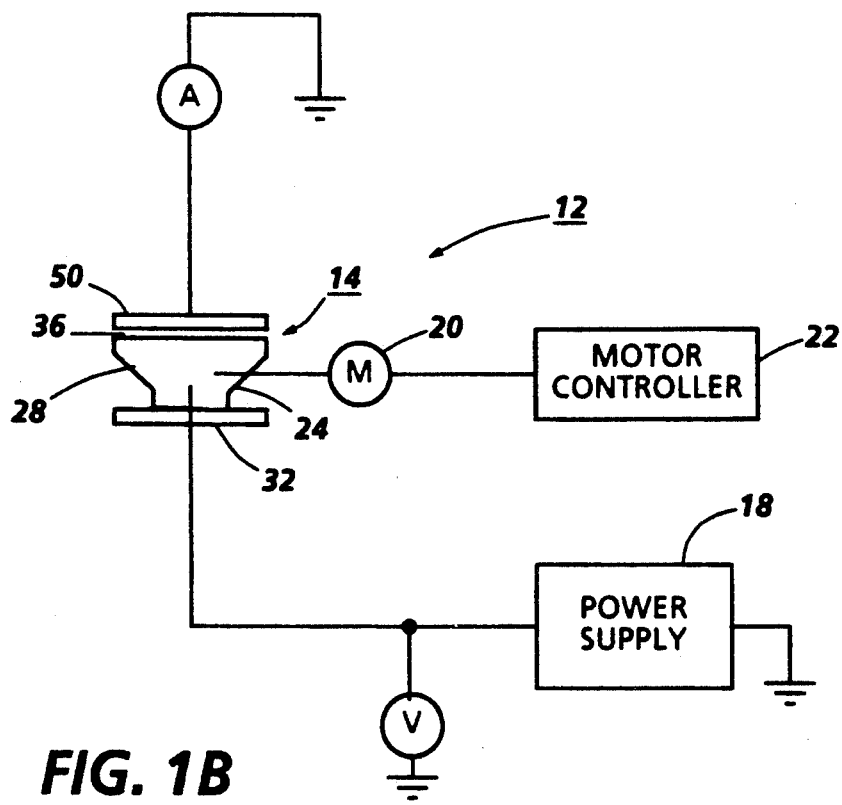
FIG. 1B is a schematic view of a network adapted to determine conductivity of a particulate material.

Referring to FIGS. 1A and 1B, arrangements 10 and 12, respectively suitable for determining magnitudes of breakdown voltage and conductivity for developer material, are shown. As will be appreciated by those skilled in the art, the arrangements 10 and 12 are capable of respectively measuring the magnitudes of breakdown voltage and conductivity of particulate materials other than developer material. Moreover, developer material, as referred to hereinafter, can be used to designate carrier material alone, toner material alone or any combination of carrier and toner.

Figure 2:
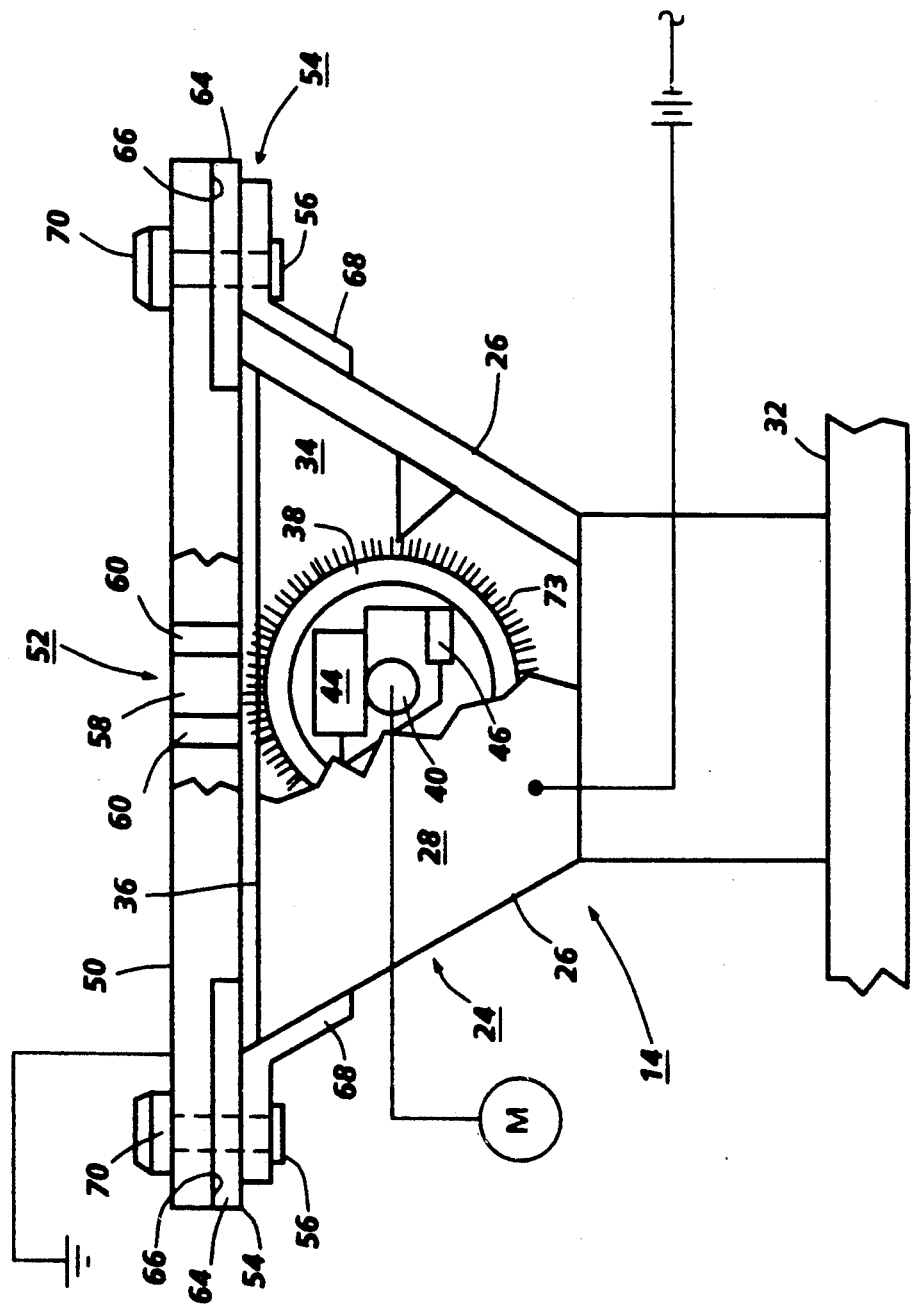
FIG. 2 is an elevational, partially broken-away view of a voltage breakdown cell used in the network of either FIG. 1A or FIG. 1B.
Figure 3:
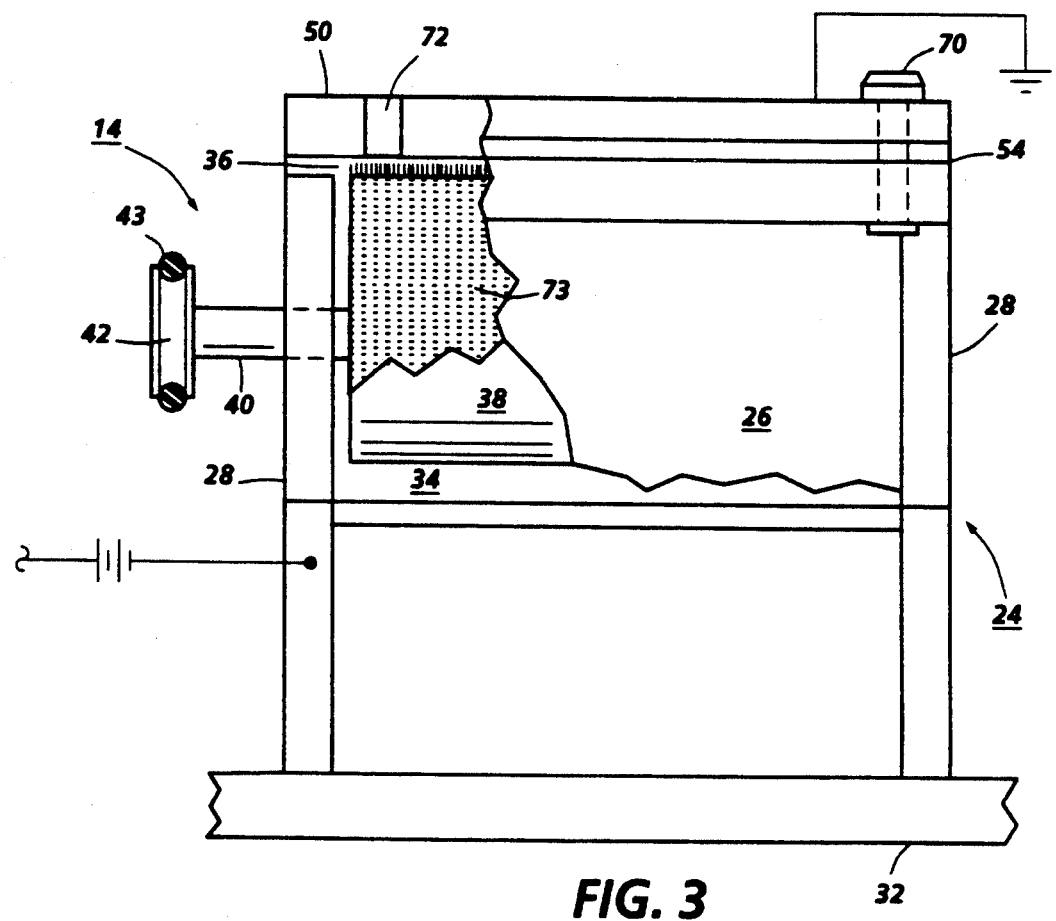
FIG. 3 is an elevational, partially broken-away view of the voltage breakdown cell of FIG. 2.
Figure 4:
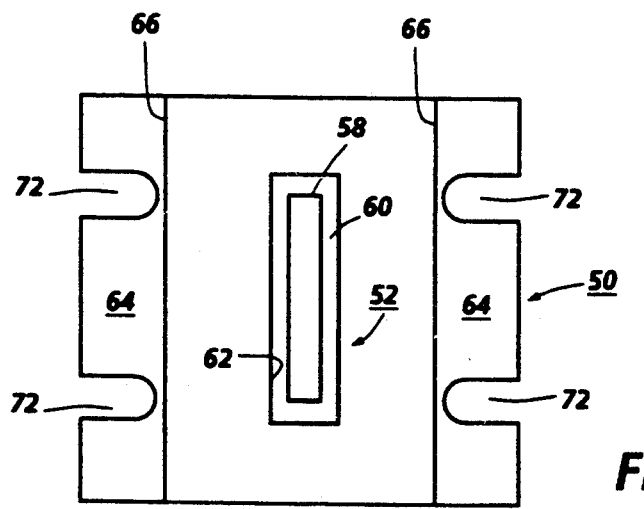
FIG. 4 is a bottom plan view of a top plate used in the voltage breakdown cell of FIG. 2.

The arrangement 10, which is adapted to determine breakdown voltage, includes a storage assembly 14 coupled respectively with a measuring circuit 16, a power supply 18 and a motor 20. The starting and/or stopping of the motor 20 can be controlled by way of a conventional motor controller 22. Referring to FIGS. 2-4, the structure of the storage assembly or voltage breakdown cell ("VB Cell") 14 is shown in further detail. The voltage breakdown cell 14 includes a hopper 24, the hopper 24 being defined by front and rear walls 26 as well as side walls 28. The walls 26, 28 extend upwardly from a base 32 and define a hollow cavity 34 having a top entrance opening 36.

A bias roller 38 having a shaft 40 is disposed in the hollow cavity 34 and rotatably mounted in the sidewalls 28. An end of the shaft 40 (FIG. 3) is coupled to the motor 20 by way of a pulley 42 and a timing belt 43. The roller 38 encompasses magnets 44,46 and rotates relative thereto. As will be appreciated by those skilled in the art of development apparatuses, the magnets 44,46 are configured so that when the surface of the roller 38 is coated with a developer material, having a substantial ferromagnetic content, the coating near the top of the roller 38 is thicker than the rest of the coating. The opening 36 is selectively covered by a top plate 50.

The plate 50 includes an electrode assembly 52 (FIGS. 2 and 4), hopper insulating means 54 and fastening assembly 56. The electrode assembly 52 is defined by an electrode 58 and insulating ribbon 60, portions of the electrode 58 and the ribbon 60 being mounted in a milled-out slot 62. The insulating ribbon 60 electrically isolates the electrode 58 from the rest of the plate 50. It will be appreciated from the discussion below that the electrode assembly 52 is only employed in the measurement of conductivity.

The hopper insulating means 54 includes insulating strips 64, the insulating strips 64 being fitted in milled-out slots 66. The top plate 50 can be insulated from the hopper 24 by means other than hopper insulating means 54. It is merely important that the top plate 50 be electrically isolated from the hopper 24. As will be appreciated by those skilled in the art, the insulating means 54 prevents electrical leakage when a voltage is applied to the VB cell 14, so that substantially all of the voltage is applied across the bias roll 38. The fastening assembly 56 includes angle brackets 68, which brackets 68 are mounted to the walls 26. The angle brackets 68, which are preferably constructed of an insulating material, define slots 72. The slots 72 are adapted to receive conventional bolt fasteners 70 for securing the plate 50 to the hopper 24.

In the preferred embodiment, the walls 26 and the base 32 are constructed of phenolic material, while the side walls 28 are constructed of non-ferromagnetic, conductive material, such as aluminum. The roller 38 is constructed of non-ferromagnetic, conductive material and in electrical contact with the side walls 28. Referring to FIGS. 2 and 3, the walls 26 are higher than the sidewalls 28 so that a space is maintained between the plate 50 and both the top of side walls 28 and the top of the roller 38. The space is filled by a magnetic brush 73, the brush 73 being formed on the roller 38 and just touching the bottom of the plate 50. The thickness of the brush 73 is regulated by a metering blade 74, the metering blade 74 being mounted to an inner surface of the front wall 26. In one example, the distance between the plate 50 and the top of the roller 38 as well as the distance between the roller 38 and the metering blade 74 are about 0.1 inch.

When the plate 50, along with the electrode assembly 52, is grounded, and power is applied to the side walls 28 by way of power supply 18, a voltage is developed between the side walls 28 and the grounded plate 50. Moreover, since the resistance of the developer material is, in most cases, substantially greater than the combined resistance of the sidewalls 28 and the roller 38, this developed voltage is substantially equal to the voltage of the developer material.

To determine breakdown voltage (FIG. 1A), the measuring circuit 16 is placed in series with the VB Cell 14. In the illustrated embodiment of FIG. 1A, the measuring circuit 16 comprises a sensing resistor 76, which is about 100 kilo-ohms, and a conventional voltmeter, the voltmeter being connected in parallel with the sensing resistor 76. In operation, the entire plate 50 is grounded and the motor 20 is set at a uniform speed by use of motor controller 22. The magnetic brush 73 is formed by pouring a preselected quantity of developer material onto the rotating roller 38. While running the motor 20, no voltage is applied to both the developer material and the sensing resistor 76 for a preselected time interval—about 3 minutes in one example—to break-in or "condition" the developer material. For some developers, conditioning reduces significantly measurement error generated by surface chemical and physical changes in the developer material.

After the conditioning period, the power is increased, in a rampwise manner, until the voltage across the sensing resistor 76, as measured on the voltmeter, achieves a preselected level. In one example, the breakdown voltage is achieved when the voltage across the sensing resistor 76 is about 10 volts. That is, for this example, when the voltage across the sensing resistor 76 equals 10 volts, the voltage across the developer material, is substantially equal to the breakdown voltage.

Measuring breakdown voltage with the arrangement 10, requires a relatively high degree of facility on the part of the operator. In particular, the operator is required to manually step or ramp the power supply 18 while watching the resultant reading on the voltmeter. Substantial error in measurement of breakdown voltage can be generated when the operator ramps the power at irregular intervals and/or takes too long to ramp the sensing resistor 76 up to a preselected level, such as 10 volts. Even assuming that one operator could reproduce the procedure with some degree of regularity, variation in results would inevitably occur among a group of operators, since no one operator could execute the procedure, nor read the output of the sensing resistor 76, in exactly the same way as the other operators. Additionally, as a result of the noise of the voltmeter, it is typically difficult to determine which applied voltage corresponds to the 10 volt reading of the voltmeter. Hence, in the most preferred embodiment, the determination of the breakdown voltage for the developer material in the VB cell 14 is accomplished with an automated system, including a voltage breakdown autometer ("VB Autometer").

Figure 5:
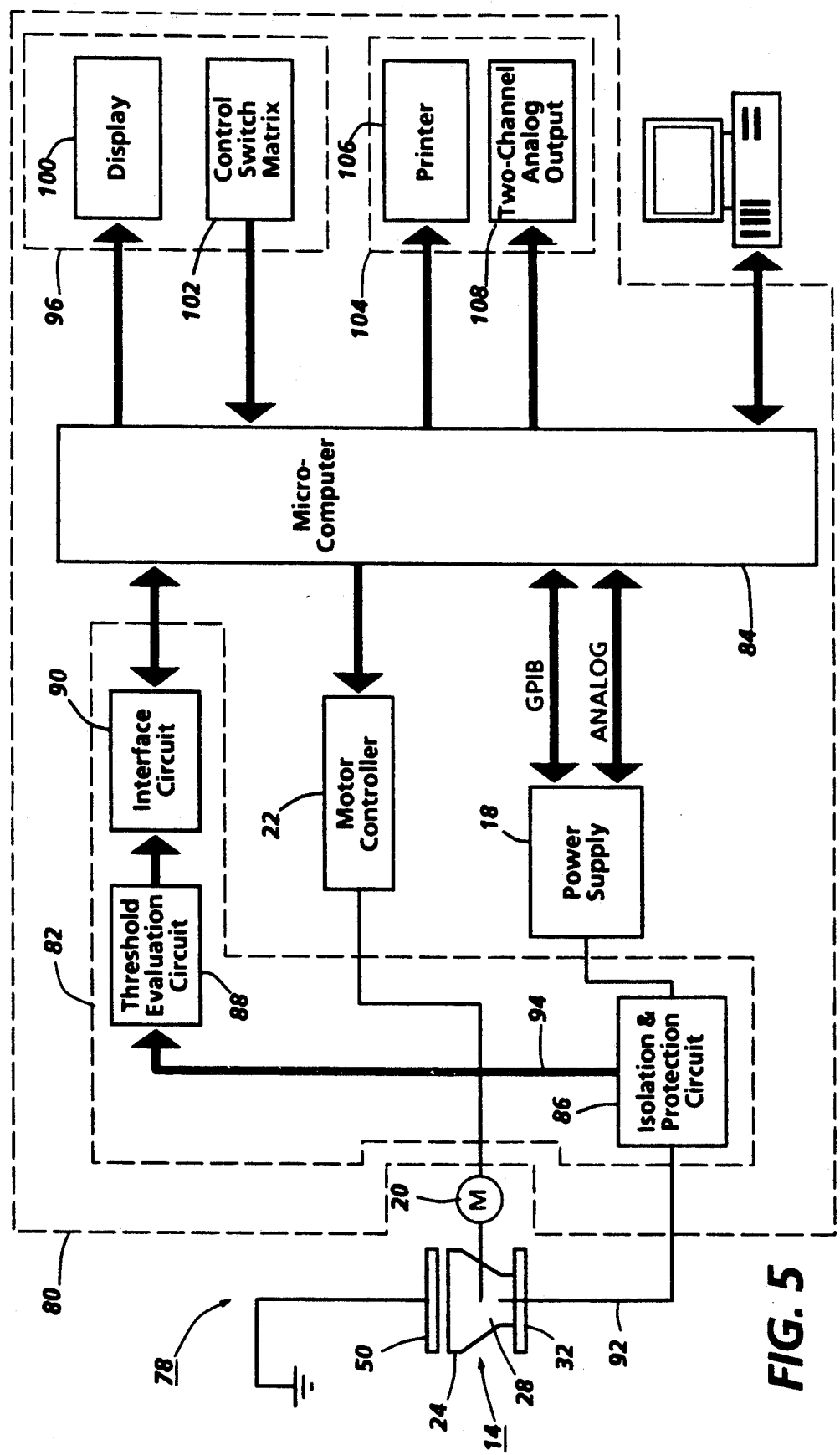
FIG. 5 is a schematic view similar to the FIG. 1A network, except that an "autometer" is used to automatically implement both operation and control of the network.

Referring to FIG. 5, the automated system and the VB Autometer are indicated respectively by the numerals 78 and 80. The VB autometer 80 includes the power supply 18, the motor controller 22, a measuring circuit 82 and automatic processor means 84. It will be recognized, by comparing FIG. 1A and FIG. 5, that automated system 78 and arrangement 10 are similar except that the measuring circuit 82 has been substituted for measuring circuit 16, and that a substantial amount of control and measurement resides in the automatic processor means 84.

In the illustrated embodiment of FIG. 5, the automatic processor means 84 comprises an 8-Bit single-board microcomputer operatively associated with a sufficient number of timers and interrupts as well as appropriate amount of memory, namely RAM and EPROM. In one example, the microcomputer comprises a Mitsubishi M50734 microcomputer. The microcomputer transmits signals to and receives signals from the power supply 18 by way of conventional ADC and DAC circuitry. Further control of the power supply 18 is achieved by way of a general purpose interface bus (GPIB), such as a standard IEEE 488 data bus.

The measuring network 82 includes an isolation and protection circuit 86, a threshold evaluation circuit 88 and an interface circuit 90. The isolation and protection circuit 86, which receives power from the power supply 18, has a first output 92 and second output 94 that are respectively connected to the VB cell 14 and the threshold evaluation circuit 88. The isolation and protection circuit 86 electrically isolates the output of the power supply 18 from the microcomputer by known means, such as isolation amplifiers or transformers. As should be recognized, the isolation and protection circuit 86 includes the sensing resistor 76 or a sensing subcircuit that at least simulates the properties associated with the sensing resistor 76. Consequently, the second output 94 of the isolation and protection circuit 86 responds to the ramping of power supply 18 in the same manner that the output across the sensing resistor 76 (FIG. 1A) of measuring circuit 16 responds to the power supply 18. The threshold evaluation circuit 88 includes conventional A/D circuitry for digitizing the second output 94. Additionally known sampling circuitry is provided to determine whether the digitized output 94 exceeds preselected threshold levels. The interface circuit 90 includes standardized I/O circuitry that is customized for use with the desired microcomputer.

The microcomputer communicates with an operator interface 96. The operator interface 96 includes a display 100 and a control switch matrix 102. Breakdown voltage magnitudes can be displayed at one of two data output devices 104, which devices 104 can include a printer 106 and a two-channel analog output 108. For more elaborate data manipulation the microcomputer can be provided with an RS-232 interface for downloading of results to a computer of greater capacity than the microcomputer.

The concept underlying the operation of the automated system 78 is very similar to that of measuring circuit 16—the major distinction being that all manual operations are performed by the VB autometer 80. Consequently, the need for human operation is minimized. In particular the desired operating conditions of the VB autometer 80 are programmed into one of a plurality of menus, the menus being stored in the microcomputer and accessed through use of the control switch matrix 102. An exemplary menu, including some ranges of magnitudes and a few descriptive indicators, follows:

Rate of Output from Power Supply 18: 10–90 VDC/Sec.
Step Size of Output from Power Supply 18: 1–15 VDC
Detection Level at which Breakdown Voltage Occurs: 1 to 15 VDC (typically 1 or 10 VDC is chosen)
Number of Times that Process is Repeated: 1–10 Times
Conditioning Time of Sample(s): 0–5 minutes (typically about 3 minutes)
Maximum Voltage of Output from Power Supply 18: About 3000 VDC
Maximum Current of Output from Power Supply 18: 10 milliAmperes
Detection Input at Operator Interface 96: Raw or RMS Value A couple of comments regarding this menu are in order. First, through use of the menu allows operation to be repeated automatically for one or more samples. Such repetition can be particularly useful in quality control work in which, for example, many samples of similar composition are compared against a known standard. Second, the microcomputer is provided with a RMS converter so that outputs detected by the microcomputer, such as the second output 94, can be averaged and plotted on the two-channel analog output device of the data output devices 104.

In operation, after the desired menu is selected, the program is started and the developer material is conditioned. After conditioning is accomplished, with the roller 38 rotating, the power supply 18 is ramped up, in stepwise fashion, in response to incremental voltage changes transmitted from the microcomputer. Once the voltage across the sensing subcircuit reaches a preselected value, such as 10 VDC, the microcomputer closely approximates the voltage across the developer material, i.e. breakdown voltage, by detecting the corresponding output voltage of the power supply 18, and then turns off the power supply 18. Various forms of data manipulation may be used to determine when the 10 volts has been reached with sufficient certainty. For example, the microcomputer is capable of taking a preselected number of readings, e.g. 100 readings, for each preselected voltage step, e.g. 1 VDC. In one program, the power supply 18 is shut off once a preselected number of the 100 readings, e.g. 51 readings, is greater than 10 volts. As will be appreciated by those skilled in the art, the microcomputer can be programmed to make the approximate magnitude for breakdown voltage exact. That is, the microcomputer can compensate for the dissipation attributed to the voltage drop across the sensing subcircuit.

Referring again to FIG. 1B, the arrangement 12, which is adapted to determine conductivity, includes the VB cell 14 coupled respectively with the power supply 18 as well as the voltmeter and an ammeter. It should be noted that the arrangement 12 does not employ the measuring circuit 16. Additionally, the electrode 58 (FIG. 2), which overlies the coated roller 38, is not grounded. As in the procedure to determine breakdown voltage, the magnetic brush is formed by pouring developer material on the motor-driven roller 38, and conditioning the developer material. To measure conductivity, the motor 20 is turned off, a preselected voltage, such as 10 or 200 VDC, is applied to the VB cell 14 and stabilized measurements are taken across the power supply 18 and the ammeter. The conductivity of the particulate material is characterized by the following expression:

$$\text{Conductivity} = K((I_{OUT})/(V_{APPLIED}))$$

where,
$I_{OUT}$ = Current Output of VB Breakdown Cell 14,
$V_{APPLIED}$ = Output Voltage across Power Supply 18 (which is typically equal to the voltage across the developer material)
$K$ = (Space between Roller 38 and Electrode 58)/(Surface Area of Electrode 58)
In the preferred embodiment, the value of K is 0.0847 $cm^{-1}$.

It will be appreciated that the resulting current measurement is not straight-forward and requires operator judgement. That is, when a voltage is applied to the VB cell 14 and across the developer material, the resulting current flow varies with time. Although there are various known procedures to alleviate attendant problems, in the preferred embodiment, an automated measuring system is used to monitor the current readings and determine a stable moment at which to precisely take the reading so that operator error can be minimized. In one example, an automated system is achieved by replacing the ammeter with an arrangement employing some of the same components as those employed in VB autometer 80. In particular, the VB cell 14 could be coupled with the automatic processor means 84 by way of a measuring circuit (not shown). The measuring circuit would possess the measuring capabilities of the voltmeter and the ammeter as well as employ the threshold evaluation circuit 88.

What is claimed is:
1. An apparatus for determining breakdown voltage of a particulate material, comprising:
   means for storing a preselected quantity of the particulate material;
   means for applying a first voltage across at least a portion of the preselected quantity of the particulate material so that a second voltage, which varies in magnitude as a function of the first voltage, is developed, said applying means progressively varying the magnitude of the first voltage until the second voltage substantially equals a preselected reference voltage;

means, coupled to said storing means, for measuring the second voltage, wherein the breakdown voltage substantially equals the first voltage when the second voltage substantially equals the preselected reference voltage.

2. The apparatus of claim 1, wherein said storing means comprises a voltage breakdown cell adapted to support the preselected quantity of particulate material with at least portions of said voltage breakdown cell being in electrical communication with the portion of the preselected quantity of the particulate material.

3. The apparatus of claim 1, wherein said applying means comprises a programmable microcomputer.

4. An apparatus for determining breakdown voltage of a particulate material, comprising:

a voltage breakdown cell adapted to support a preselected quantity of the particulate material with at least portions of said voltage breakdown cell being in electrical communication with at least a portion of the preselected quantity of the particulate material;

power supply, operatively coupled to said voltage breakdown cell portions, for generating a first voltage across the portion of the preselected quantity of the particulate material therein;

a measuring circuit coupled to said voltage breakdown cell, said measuring circuit measuring a second voltage when said power supply generates the first voltage; and automatic processor means, communicating with both said power supply and said measuring circuit, for progressively increasing the magnitude of the first voltage and detecting when the level of the second voltage is substantially equal to a predetermined reference level, wherein when the second voltage level is substantially equal to the predetermined reference level, the first voltage is proportional to the breakdown voltage of the particulate material.

5. The apparatus of claim 4 in which the particulate material comprises developer material, wherein said voltage breakdown cell comprises:

a housing defining a chamber with at least portions of said housing being conductive;

means, operatively mounted to said conductive housing portions, for supporting the preselected quantity of the developer material; and a plate member having a preselected region thereof superposed with said chamber, said plate member being spaced from said housing portions, and said plate member being in electrical communication with at least a portion of the preselected quantity of the particulate material.

6. The apparatus of claim 5, wherein a substantial portion of said plate member is grounded.

7. The apparatus of claim 5, wherein said voltage breakdown cell further comprises insulating means for preventing flow of current between said conductive housing portions and said plate member, at least a portion of said insulating means being disposed integrally with said plate member.

8. The apparatus of claim 7, wherein said insulating means comprises thermoplastic material.

9. The apparatus of claim 5, wherein said supporting means comprises an electrically biased roller rotatably mounted in said conductive housing portions and said electrically biased roller being located in said chamber so that as said electrically biased roller rotates, developer material is attracted thereto to form a magnetic brush.

10. The apparatus of claim 4, wherein said automatic processor means comprises a programmable microcomputer.

11. A method for determining the breakdown voltage of a preselected quantity of particulate material, comprising the steps of:

generating a first voltage across a voltage breakdown cell having portions thereof in electrical communication with at least a portion of the preselected quantity of the particulate material;

measuring a second voltage across a circuit coupled to the voltage breakdown cell;

comparing the level of the second voltage with a predetermined reference level; and automatically increasing the level of the first voltage until the second voltage level is substantially equal to the predetermined reference level, wherein when the second voltage level is substantially equal to the predetermined reference level, the first voltage is proportional to the breakdown voltage of the particulate material.

12. The method of claim 11, wherein the level of the first voltage is increased automatically in a stepwise manner.

13. The method of claim 11, further comprising the step of grounding a portion of the voltage breakdown cell.

* * * * *